United States Patent
Park et al.

(10) Patent No.: US 9,004,002 B2
(45) Date of Patent: Apr. 14, 2015

(54) MASK ASSEMBLY HAVING A PLURALITY OF PROJECTIONS AT A BOUNDARY OF ADJACENT TWO DEPOSITION MASKS

(75) Inventors: Chong-Hyun Park, Daegu (KR); Tae-Hyung Kim, Daegu (KR); Il-Hyun Lee, Siheung-si (KR)

(73) Assignee: LG Display Co., Ltd., Seoul (KR)

( * ) Notice: Subject to any disclaimer, the term of this patent is extended or adjusted under 35 U.S.C. 154(b) by 123 days.

(21) Appl. No.: 12/978,831

(22) Filed: Dec. 27, 2010

(65) Prior Publication Data

US 2011/0185965 A1    Aug. 4, 2011

(30) Foreign Application Priority Data

Feb. 3, 2010    (KR) .......................... 10-2010-0009849

(51) Int. Cl.
| | | |
|---|---|---|
| *C23C 14/04* | (2006.01) | |
| *B05C 21/00* | (2006.01) | |
| *C23C 16/04* | (2006.01) | |
| *H01L 51/00* | (2006.01) | |
| *B05C 11/00* | (2006.01) | |
| *B05D 1/32* | (2006.01) | |

(52) U.S. Cl.
CPC ............. *C23C 14/042* (2013.01); *B05C 21/005* (2013.01); *C23C 16/042* (2013.01); *B05D 1/32* (2013.01); *B32B 2457/202* (2013.01); *H01L 51/0011* (2013.01); *B05C 11/00* (2013.01)

(58) Field of Classification Search
CPC .... B05C 13/00; B05C 21/005; C23C 14/042; C23C 14/04; C23C 16/042; C23C 16/04; H01L 51/0011; H01L 27/3223; H01L 21/682; H01L 21/366; H01L 21/308; H01L 21/6715; H01L 21/368; G03F 1/00; G03F 2007/00; B32B 2457/202; B32B 2457/204; B32B 2457/206; B32B 2457/208; B05D 1/32; B05B 15/045
USPC ......... 349/113, 187; 430/5, 30, 296; 118/500, 118/504, 505; 156/345.19, 345.3; 438/22, 438/377, 531, 552, 942; 437/80; 101/127; 216/13, 24, 41; 445/24; 269/287
See application file for complete search history.

(56) References Cited

U.S. PATENT DOCUMENTS

| | | | | |
|---|---|---|---|---|
| 2,040,988 | A | * | 5/1936 | Gragg ............................ 101/127 |
| 3,323,967 | A | * | 6/1967 | Webb ........................ 156/345.19 |
| 3,652,895 | A | * | 3/1972 | Tsuneta et al. ................. 313/403 |
| 3,698,903 | A | * | 10/1972 | Dodd .................................. 430/5 |
| 3,823,048 | A | * | 7/1974 | Hetrich ...................... 156/345.19 |
| 3,834,905 | A | * | 9/1974 | Dodd ................................ 355/77 |
| 3,873,405 | A | * | 3/1975 | Wilkes ............................ 40/702 |
| 5,286,343 | A | * | 2/1994 | Hui .................................. 216/41 |
| 5,309,264 | A | * | 5/1994 | Lien et al. ........................ 349/143 |
| 5,424,173 | A | * | 6/1995 | Wakabayashi et al. ........ 430/296 |

(Continued)

FOREIGN PATENT DOCUMENTS

| | | |
|---|---|---|
| CN | 1578563 | 2/2005 |
| CN | 101440476 | 5/2009 |

*Primary Examiner* — Dah-Wei D Yuan
*Assistant Examiner* — Karl Kurple
(74) *Attorney, Agent, or Firm* — McKenna Long & Aldridge LLP

(57) ABSTRACT

A mask assembly is disclosed to improve organic material deposition efficiency including: a plurality of deposition masks, at least one of opposite ends of each of the plurality of deposition masks is formed to have a plurality of projections, which form at least one boundary aperture region at a boundary of adjacent two deposition masks.

7 Claims, 5 Drawing Sheets

(56) References Cited

U.S. PATENT DOCUMENTS

| | | | |
|---|---|---|---|
| 5,489,337 A * | 2/1996 | Nomura et al. | 118/677 |
| 5,770,123 A * | 6/1998 | Hatakeyama et al. | 264/1.21 |
| 5,784,135 A * | 7/1998 | Inada et al. | 349/85 |
| 6,090,510 A * | 7/2000 | Tokuda | 430/30 |
| 6,090,527 A * | 7/2000 | Yamazaki et al. | 430/296 |
| 6,189,448 B1 * | 2/2001 | O'Neal et al. | 101/127 |
| 6,407,786 B1 * | 6/2002 | Yamamoto et al. | 349/113 |
| 6,475,287 B1 * | 11/2002 | Clark | 118/721 |
| 6,586,144 B2 * | 7/2003 | Michiels et al. | 430/5 |
| 6,589,382 B2 * | 7/2003 | Clark et al. | 156/304.3 |
| 6,630,775 B1 * | 10/2003 | Shin et al. | 313/407 |
| 6,749,690 B2 * | 6/2004 | Clark | 118/721 |
| 6,827,622 B2 * | 12/2004 | Yamada et al. | 445/24 |
| 6,926,840 B2 * | 8/2005 | Clark | 216/12 |
| 6,952,247 B2 * | 10/2005 | Song et al. | 349/113 |
| 7,388,653 B2 * | 6/2008 | Kim | 355/77 |
| 7,396,558 B2 * | 7/2008 | Fujimori et al. | 427/66 |
| 7,582,394 B2 * | 9/2009 | Noda et al. | 430/5 |
| 7,656,499 B2 * | 2/2010 | Kida et al. | 349/189 |
| 7,781,956 B2 * | 8/2010 | Takagi et al. | 313/498 |
| 7,943,054 B2 * | 5/2011 | Nishiwaki et al. | 216/41 |
| 8,251,010 B2 * | 8/2012 | Sasaki et al. | 118/505 |
| 2001/0039891 A1 * | 11/2001 | Takeuchi et al. | 101/128.21 |
| 2002/0102754 A1 * | 8/2002 | Fujimori et al. | 438/22 |
| 2005/0024622 A1 * | 2/2005 | Kim | 355/75 |
| 2005/0118788 A1 * | 6/2005 | Kuwahara et al. | 438/455 |
| 2006/0044506 A1 * | 3/2006 | Kida et al. | 349/187 |
| 2007/0266943 A1 * | 11/2007 | Yeh et al. | 118/721 |
| 2008/0224594 A1 * | 9/2008 | Takagi et al. | 313/498 |
| 2008/0242093 A1 * | 10/2008 | Nishiwaki et al. | 438/694 |
| 2008/0302257 A1 * | 12/2008 | Yeh et al. | 101/127 |
| 2009/0025581 A1 * | 1/2009 | Cho et al. | 101/127 |
| 2009/0128727 A1 * | 5/2009 | Yata | 349/46 |
| 2009/0137180 A1 * | 5/2009 | Sung et al. | 445/60 |
| 2009/0151630 A1 * | 6/2009 | Marcanio et al. | 118/504 |
| 2009/0268151 A1 * | 10/2009 | Matsuoka et al. | 349/187 |
| 2009/0297958 A1 * | 12/2009 | Lee et al. | 430/5 |
| 2010/0267227 A1 * | 10/2010 | Ko et al. | 438/597 |
| 2011/0139069 A1 * | 6/2011 | Ahn et al. | 118/504 |
| 2011/0174217 A1 * | 7/2011 | Gersdorff et al. | 118/500 |
| 2011/0179996 A1 * | 7/2011 | Park et al. | 118/504 |
| 2011/0185966 A1 * | 8/2011 | Lee et al. | 118/504 |
| 2012/0145076 A1 * | 6/2012 | Shin et al. | 118/504 |
| 2012/0147351 A1 * | 6/2012 | Jak et al. | 355/71 |
| 2012/0171807 A1 * | 7/2012 | Berger et al. | 438/73 |
| 2012/0240850 A1 * | 9/2012 | Kobayashi et al. | 118/504 |
| 2012/0328851 A1 * | 12/2012 | Kang | 428/195.1 |
| 2013/0174780 A1 * | 7/2013 | You et al. | 118/505 |
| 2013/0210213 A1 * | 8/2013 | Nair et al. | 438/401 |
| 2013/0314685 A1 * | 11/2013 | Shin | 355/72 |
| 2014/0137798 A1 * | 5/2014 | Ahn et al. | 118/504 |
| 2014/0141556 A1 * | 5/2014 | Lee | 438/34 |

\* cited by examiner

MASK ASSEMBLY HAVING A PLURALITY OF PROJECTIONS AT A BOUNDARY OF ADJACENT TWO DEPOSITION MASKS

CROSS REFERENCE TO RELATED APPLICATION

This application claims the benefit of the Patent Korean Application No. 10-2010-0009849, filed on Feb. 3, 2010, which is hereby incorporated by reference as if fully set forth herein.

BACKGROUND OF THE DISCLOSURE

1. Field of the Disclosure

The present invention relates to mask assemblies, and more particularly, to a mask assembly which can improve organic material deposition efficiency and characteristic uniformity of a finished organic light emitting display device in a process of forming an organic layer of the organic light emitting display device.

2. Discussion of the Related Art

Recently, the increasing prominence of information technology has led to advances in display technology for visually displaying electrical information signals. Accordingly, a variety of flat panel displays having superior performance including slim design, low weight and low power consumption have been developed and rapidly replaced conventional Cathode Ray Tubes (CRT).

Representative examples of flat panel displays may include a Liquid Crystal Display (LCD), Plasma Display Panel (PDP), Field Emission Display (FED), Electro Luminescent Display (ELD), Electro-Wetting Display (EWD), and Organic Light Emitting Diode (OLED) display.

Of the aforementioned displays, an organic light emitting diode (hereinafter, referred to as "OLED") displays an image using organic light emitting diodes. An OLED is designed to generate light of a specific wavelength by exciton energy generated by recombination of electrons and holes. Such an OLED has advantages including superior display characteristics, such as high contrast ratio and fast response time, and easy realization of a flexible display, and, it may be classed as such an ideal next generation display.

In a general OLED, an active area in which a plurality of subpixels is arranged in a matrix and a remaining area, referred to as an inactive area, are defined. Each subpixel includes a thin-film transistor and an organic light emitting diode. The organic light emitting diode includes a first electrode, an organic layer, and a second electrode. The organic layer includes a hole injection layer, a hole transport layer, a light emitting layer, an electron transport layer, and an electron injection layer. The OLED having the above described configuration displays an image by applying a voltage of several volts to the first electrode and the second electrode. Thereby, current passing through the organic layer induces emission of light. That is, the OLED displays an image using the principle of emitting light using remnant energy which is generated by an exciton falling back to a ground state. The exciton is generated by recombination of hole and electron injected from the first electrode and the second electrode.

Meanwhile, in an organic layer forming process, a mask assembly is used to form light emitting regions corresponding to the subpixels. In this case, the mask assembly includes a frame coupled to the deposition mask and a deposition mask which is formed of a metal or plastic thin film and includes an aperture area corresponding to the active area and an intercepting area outside of the aperture area. In the mask assembly, the deposition mask is flat in an unfolded state thereof and is coupled to the frame via, e.g., welding. The frame is configured to maintain the flat state of the deposition mask.

To achieve improved yield by simultaneously manufacturing a plurality of organic light emitting displays, or to increase a size of an organic light emitting display, a size of a substrate is gradually increasing. This necessitates an increase in the size of the mask assembly to correspond to the substrate.

As described above, when a single deposition mask constitutes a large mask assembly, the deposition mask should have a large size. Therefore, even if the deposition mask is coupled to the frame in a stretched state, the deposition mask may sag under the weight. This sagging deposition mask may not come into close contact with the substrate, thereby making it difficult to perform deposition of organic matter according to a designed pattern. Moreover, if excessive tensile force is applied to the deposition mask to prevent the sag phenomenon, the tensile force may deform a pattern of the deposition mask, making it difficult to perform deposition of organic matter according to a designed pattern.

To solve the above described problems, constituting a large mask assembly corresponding to a large substrate using a plurality of deposition masks (hereinafter, referred to as "split deposition masks") has been attempted. That is, the mask assembly includes a plurality of the flat divisional deposition masks which are arranged in side by side, continuously, and coupled to the frame by welding or the like. In this instance, since each of the divisional deposition masks has comparatively small size, the sagging due to gravity can be prevented. However, since a gap is formed at a boundary of adjacent divisional deposition masks, causing the organic material to pass through the gap, a process error can take place, in which, different from a design, the organic material is deposited even at a region which is not the light emitting region. The process error makes organic material deposition efficiency and characteristic uniformity of the OLED poor.

SUMMARY OF THE DISCLOSURE

Accordingly, the present invention is directed to a mask assembly.

An object of the present invention is to provide a mask assembly in which boundaries between a plurality of deposition masks are designed as aperture region, enabling to deposit the organic material as per design at the time of organic material deposition regardless of the gap formed between the boundaries of the plurality of deposition masks for preventing the organic material deposition efficiency and the characteristic uniformity of a finished OLED from becoming poor.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a mask assembly includes a plurality of deposition masks each defined with an aperture region for passing an organic material, and a shielding region which is a periphery of the aperture region, including at least one end of opposite ends having a pattern with a plurality of projections, and a frame coupled to the plurality of deposition masks arranged continuously, wherein the plurality of projections form at least one boundary aperture region at a boundary of adjacent two deposition masks of the plurality of deposition masks.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

At first, an organic material deposition process to which a mask assembly is applied will be described.

Figure 1:
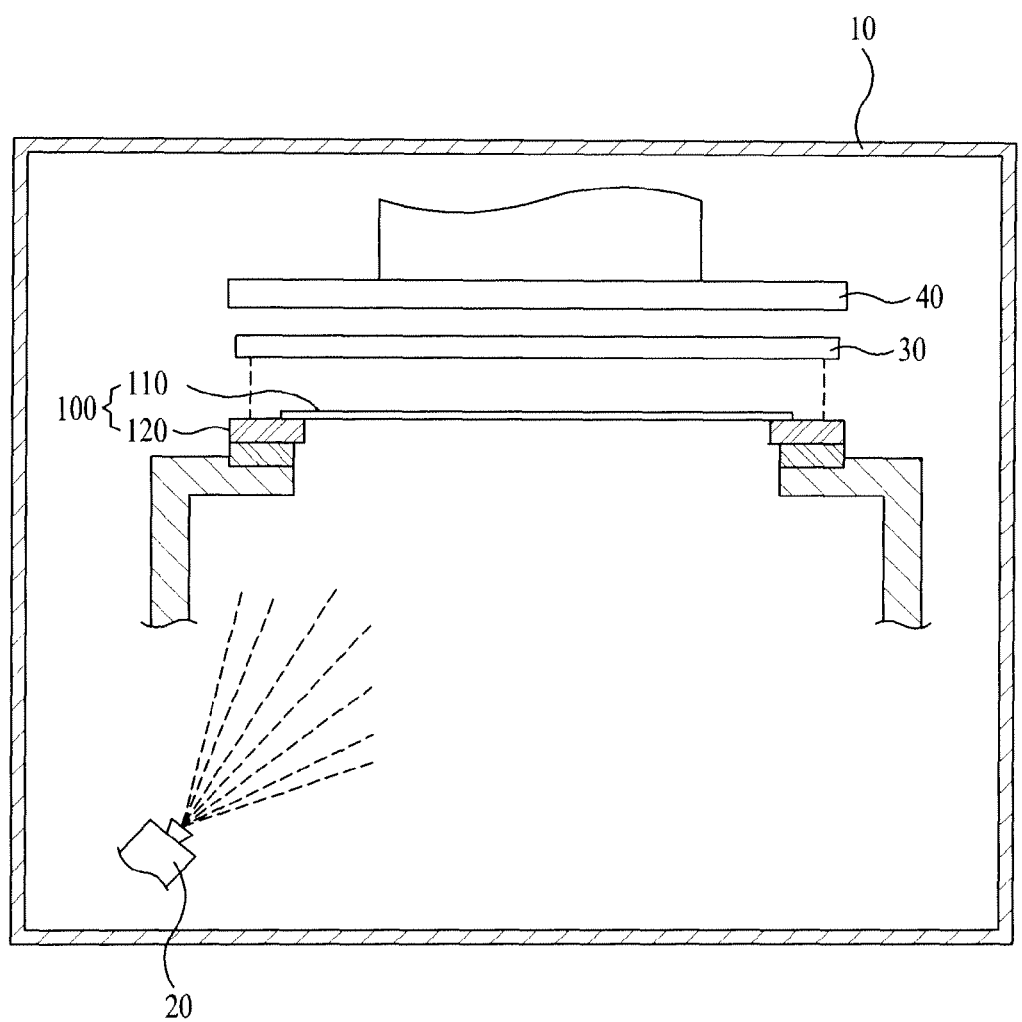
FIG. 1 illustrates a section of an exemplary apparatus for depositing an organic material in accordance with a preferred embodiment of the present invention.

FIG. 1 illustrates a section of an exemplary apparatus for depositing an organic material in accordance with a preferred embodiment of the present invention.

Referring to FIG. 1, the apparatus for depositing an organic material includes a chamber 10 having a vacuum state maintained therein, a deposition source 20 for discharging an organic material, a mask assembly 100 arranged over the deposition source 20, a substrate 30 arranged over the mask assembly 100, and a magnet unit 40 arranged to face the mask assembly 100 with the substrate 30 disposed therebetween.

While the organic material is deposited on the substrate 30, the inside of the chamber 10 is maintained at a high vacuum and a high temperature. In this instance, though not shown, in order to maintain the high vacuum, a vacuum pump like TMP (Turbo Molecular Pump) can be arranged in the chamber 10. And, though not shown, the organic material deposition apparatus can include a thickness monitoring sensor for measuring a deposition thickness of the organic material, a thickness controller for controlling operation of the deposition source 20 according to the thickness of the organic material measured thus, and a shutter for shielding the organic material emitted from the deposition source, additionally.

The deposition source 20 is a crucible arranged at a lower side of the chamber 10 for heating the organic material to make the organic material to evaporate and discharge.

The mask assembly 100 includes deposition masks 110 for making selective passing of a deposition material, and a polygonal frame 120 coupled to the deposition masks 110. The mask assembly 100 in accordance with a preferred embodiment of the present invention will be described in more detail.

The substrate 30 includes an active region in which a plurality of cells is arranged in a matrix, and depositing the organic material thereon, and a dummy region which is a periphery of the active region. In this instance, the deposition mask of the mask assembly 100 has dot unit of aperture region matrix matched to a plurality of cells arranged at the active region of the substrate 30. The organic material is deposited in a form of the dot unit of matrix at the active region of the substrate 30 through the aperture region matrix in the deposition mask 110 to form the light emitting region. And, though not shown, the organic material deposition apparatus can further include an aligner inside the chamber 10 for aligning the substrate 30 with the mask assembly 100.

Figure 2:
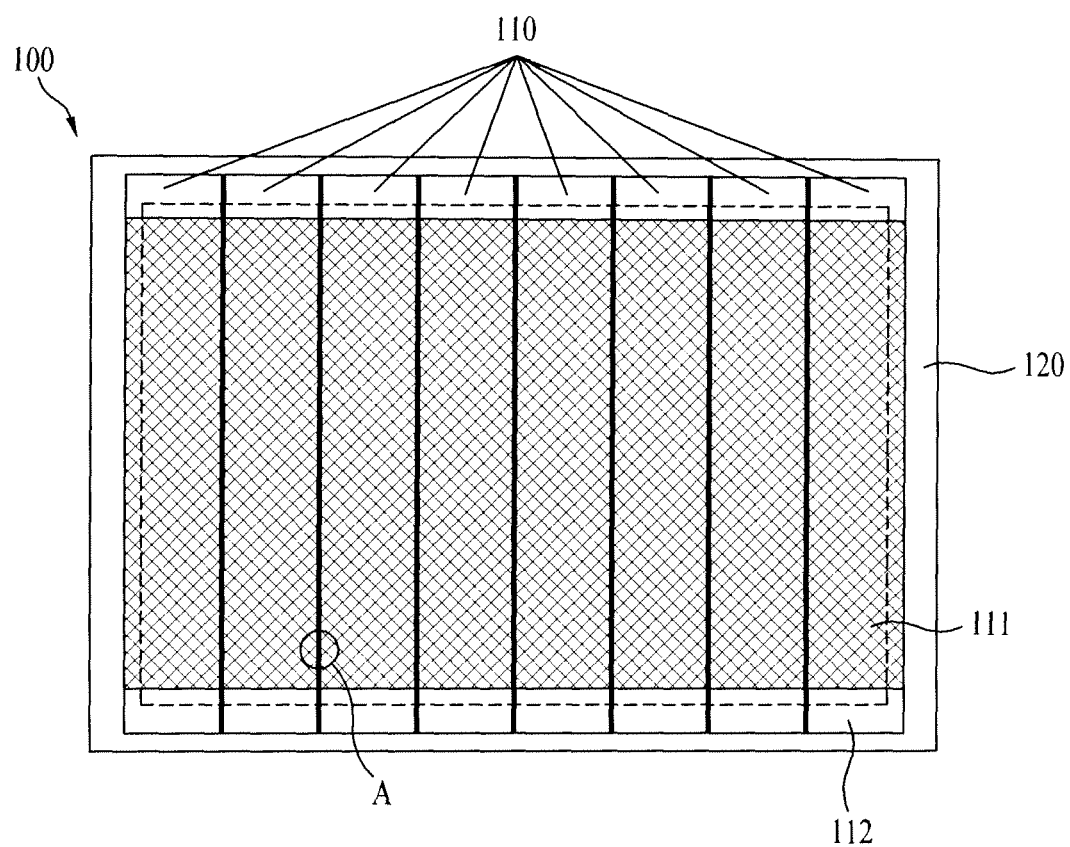
FIG. 2 illustrates a plan view of a mask assembly in accordance with a preferred embodiment of the present invention.

FIG. 2 illustrates a plan view of a mask assembly in accordance with a preferred embodiment of the present invention.

Referring to FIG. 2, the mask assembly 100 includes a plurality of deposition masks 110, and a frame 120. Each of the deposition masks 110 is defined with a mask region 111 matched to the active region of the substrate 30, and a periphery region 112 which is a periphery of the mask region 111.

The frame 120 is polygonal (FIG. 2 illustrates a rectangular frame), and coupled to a plurality of the deposition masks 110. In this instance, opposite ends (Shown as "upper and lower ends of the deposition mask 110" in FIG. 2) of the plurality of deposition masks 110 arranged flat continuously, are attached to the frame 120 with welding or the like. That is, the plurality of deposition masks 110 are coupled to the frame 120 in a state the plurality of deposition masks 110 are stretched as a predetermined tensile force is applied thereto, and the coupling of the plurality of deposition masks 110 to the frame 120 enables to maintain the tensile force applied to the plurality of deposition masks 110, to maintain the flat state of the plurality of deposition masks 110.

In the meantime, at least one of opposite ends (Shown as left and right ends of the deposition mask 110 in FIG. 2) of the plurality of deposition masks 110 is formed to have a pattern with a plurality of projections. In this instance, the one end having the pattern formed thereon is in contact with one end of an adjacent deposition mask 110. And, each of the plurality of projections includes two faced curves, and a width between two faced curves becomes the smaller as the two curves come closer to a contact point of the two curves. A plurality of the projections form at least one boundary aperture region at a boundary of adjacent deposition masks 110.

Figure 3:
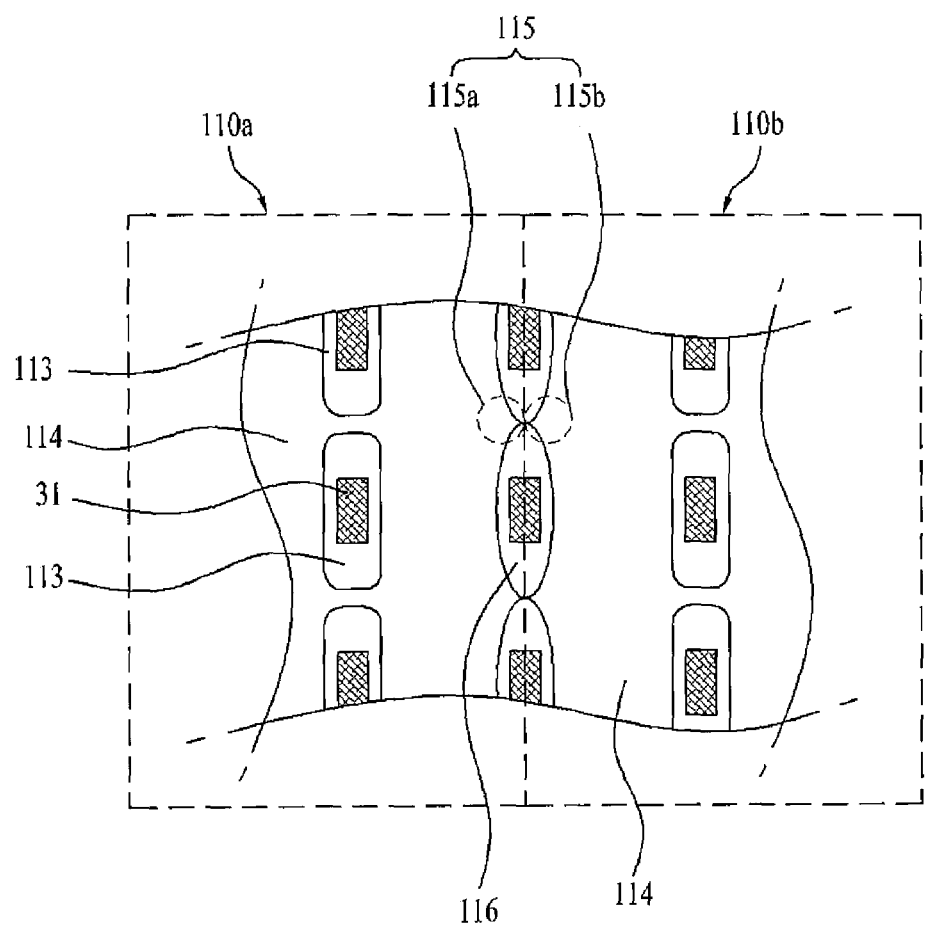
FIG. 3 illustrates a plan view of deposition masks of a mask assembly in accordance with a first preferred embodiment of the present invention.

A mask assembly 100 in accordance with a first preferred embodiment of the present invention will be descried with reference to FIG. 3 attached hereto.

FIG. 3 illustrates a plan view of deposition masks of a mask assembly in accordance with a first preferred embodiment of the present invention, which is an enlarged view of an A region in FIG. 2.

Referring to FIG. 3, the mask assembly 100 includes a plurality of deposition masks 110, and a frame 120. The plurality of deposition masks 110 are defined with a mask region 111 matched to the active region of a substrate 30, and a periphery region 112 outside of the mask region 111. And, the mask region 111 includes a plurality of aperture region 113 which are arranged in dot unit of matrix respectively according to a plurality of cell 31 formed on the active region of the substrate 30, and a shielding region 114 which is a periphery of the aperture region 113.

Since the plurality of deposition masks 110 are arranged continuously in a flat state at the time of coupling to the frame 120, the plurality of deposition masks 110 are arranged side by side. One end of each of the plurality of deposition masks 110 is disposed a boundary with an adjacent deposition mask 110, and has a pattern with a plurality of projections 115. The plurality of projections 115 are arranged at fixed intervals along the boundary with the adjacent deposition mask 110. And, each of the plurality of projections 115 includes two faced curves which meet at a contact point, which a width between the two faced curves becomes the smaller as the two curves come closer to the contact point. That is, each of the projections 115 has an apex which is the contact point at which the two curves meet, and a pointed horn shape which the two curves being symmetry with each other, become two sides of the horn shape.

Particularly, in the first embodiment, referring to FIG. 3, the pattern formed at the one end of the deposition mask 110 has a shape which a plurality of sector shaped concaves are arranged in side by side. In this instance, the plurality of concaves are arranged side by side in a direction the same to the boundary with other deposition mask 110. And, each of the plurality of projections 115 of the pattern are formed at a portion two adjacent concaves are in contact. In the meantime, the concaves can be formed by congruent sector shapes having the same radius and center angles, or depending on a designer's option, by similar sector shapes.

The pattern having the plurality of projections 115 form a plurality of boundary aperture regions 116 at the boundary between two adjacent deposition masks 110.

That is, referring to FIG. 3, a first deposition mask 110a (shown on a left side in FIG. 3) which is one of the plurality of deposition masks 110 includes a right end formed of a pattern having a plurality of first projections 115a. And, a second deposition mask 110b which is one of the plurality of deposition masks 110 and arranged on a right side of the first deposition mask 110a adjacent thereto, includes a left end formed of a pattern having a plurality of second projections 115b. In this instance, the plurality of first projections 115a at the right end of the first deposition mask 110a and the plurality of second projections 115b at the left end of the second deposition mask 110 are arranged to face each other, to form the plurality of boundary aperture regions 116.

In a process for aligning the first deposition mask 110a and the second deposition mask 110b, the contact points of the two projections 115a and 115b, facing each other, are arranged adjacent to each other so that a gap of the contact points is within a predetermined error (width), and then the first deposition mask 110a and the second deposition mask 110b are aligned. Since the contact points of each of the projections 115 are used in arranging the plurality of deposition masks 110 continuously, the process can be easy, reducing a process error in aligning the plurality of deposition masks 110.

Particularly, the plurality of first projections 115a and the plurality of second projections 115b can be aligned in symmetry with each other taking the boundary between the first deposition mask 110a and the second deposition mask 110b as a symmetry axis thereof. That is, by bringing facing first projections 115a and second projections 115b into contact, a plurality of the boundary aperture regions 116 are formed in closed curves.

Figure 4:
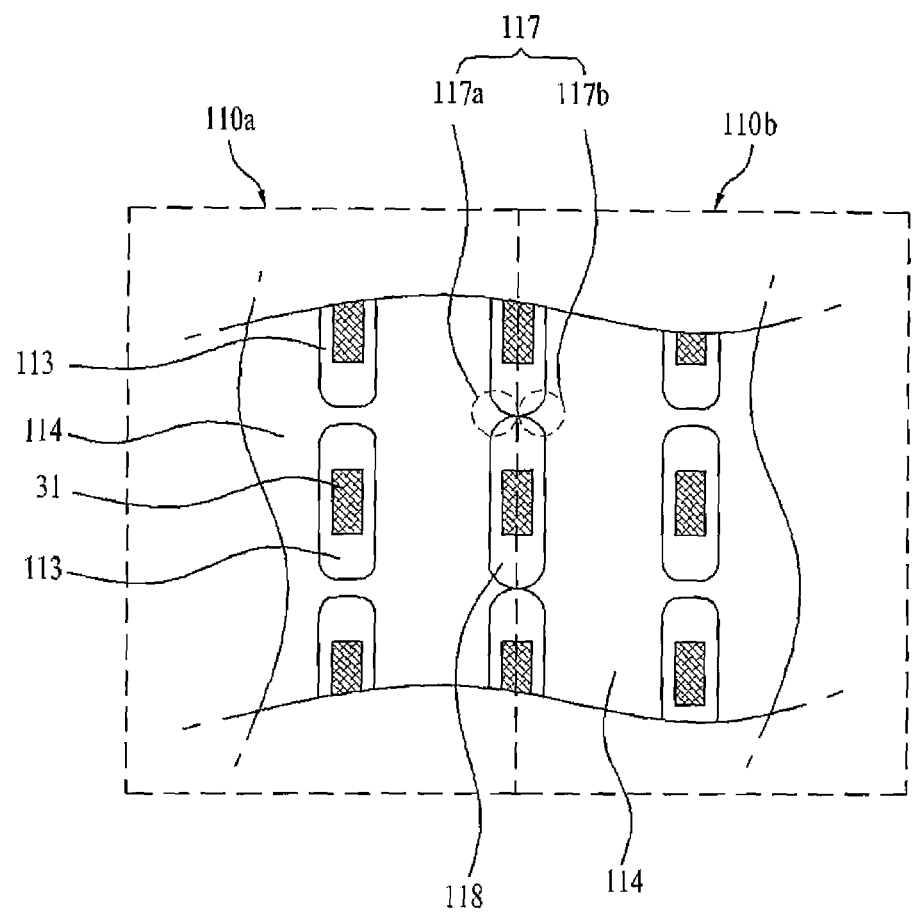
FIG. 4 illustrates a plan view of deposition masks of a mask assembly in accordance with a second preferred embodiment of the present invention.
Figure 5:
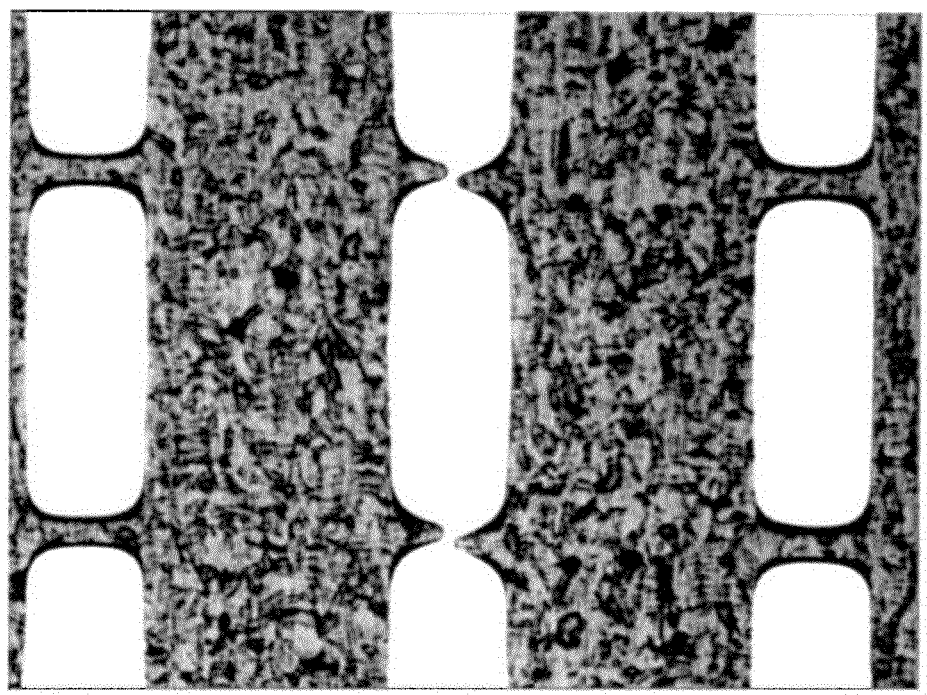
FIG. 5 illustrates a photograph of a boundary between adjacent deposition masks taken over the deposition masks.

A mask assembly 100 in accordance with a second preferred embodiment of the present invention will be descried with reference to FIGS. 4 and 5 attached hereto.

FIG. 4 illustrates a plan view of deposition masks of a mask assembly in accordance with the second preferred embodiment of the present invention, which is an enlarged view of an A region in FIG. 2. And, FIG. 5 illustrates a photograph of a boundary between adjacent deposition masks taken from over the deposition masks.

Since the mask assembly 100 in accordance with the second preferred embodiment of the present invention is identical to the mask assembly 100 in accordance with the first preferred embodiment of the present invention except that the pattern formed at one end of each of the plurality of deposition masks 110 has a shape which a plurality of rounded rectangle shaped concaves are arranged in side by side, instead of the sector shaped concaves, duplicated description thereof will be omitted.

That is, the mask assembly 100 includes a plurality of deposition masks 110, and a frame 120.

The plurality of deposition masks 110 are defined with a mask region 111 matched to the active region of a substrate 30, and a periphery region 112 outside of the mask region 111. And, the mask region 111 includes a plurality of aperture region 113 which are arranged in a dot unit of matrix respectively according to a plurality of cells 31 formed on the active region of the substrate 30, and a shielding region 114 which is a periphery of the aperture region 113.

The plurality of deposition masks 110 are arranged continuously in a flat state at the time of coupling to the frame 120. One end of each of the plurality of deposition masks 110 which forms a boundary with an adjacent deposition mask 110 has a pattern with a plurality of projections 117. The plurality of projections 117 are arranged at fixed intervals along the boundary to an adjacent deposition mask 110. And, each of the plurality of projections 117 includes two faced curves meeting at a contact point which a width between the two faced curves becomes the smaller as the two curves come closer to the contact point. That is, each of the projections 117 has an apex which is the contact point at which the two curves meet, and a pointed horn shape which the two curves being symmetry with each other, become two sides of the horn shape.

Particularly, referring to FIG. 4, in the second embodiment, the pattern formed at the one end of the deposition mask 110 has a shape which a plurality of rounded rectangle shaped concaves are arranged in side by side in a direction the same to the boundary of other deposition mask 110. In this instance, the rounded rectangle means a rectangle of which facing vertexes are rounded. In the meantime, the plurality of concaves can be congruent or similar rounded rectangles depending on designer's option.

The pattern having the plurality of projections 117 form a plurality of boundary aperture regions 118 at the boundary between two adjacent deposition masks 110.

That is, referring to FIG. 4, a first deposition mask 110a (shown on a left side in FIG. 4) which is one of the plurality of deposition masks 110 includes a right end formed of a pattern having the pattern with a plurality of third projections 117a. And, a second deposition mask 110b which is one of the plurality of deposition masks 110 and arranged on a right side of the first deposition mask 110a adjacent thereto, includes a left end formed of a pattern having the pattern with a plurality of fourth projections 117b. In this instance, the plurality of third projections 117a at the right end of the first deposition mask 110a and the plurality of fourth projections 117b at the left end of the second deposition mask 110 are arranged to face each other, to form the plurality of the boundary aperture regions 118.

That is, in a process for aligning the first deposition mask 110a and the second deposition mask 110b, the contact points of the two projections 117a and 117b, facing each other, are arranged adjacent to each other so that a gap of the contact points is within a predetermined error, and then the first deposition mask 110a and the second deposition mask 110b are aligned. That is, as shown in FIG. 5, by arranging the plurality of deposition masks 110 such that the plurality of projections 117 are adjacent to facing other projections 117, the plurality of projections 117 are used as references which enable the plurality of deposition masks 110 to be arranged side by side. Eventually, since whether alignment of the deposition masks 110 is made as per the design or not can be verified by using an extent of adjacency of the plurality of projections 117 numerically or visually, a process error can be reduced in a process of aligning the deposition masks 110.

Particularly, the plurality of third projections 117a and the plurality of fourth projections 117b can be aligned in symmetry with each other taking the boundary between the first deposition mask 110a and the second deposition mask 110b as a symmetry axis thereof. That is, by bringing facing third projections 117a and fourth projections 117b into contact, a plurality of the boundary aperture regions 118 are formed in closed curves.

Thus, according to the first or second embodiment, each of the plurality of deposition masks 110 has a plurality of projections 115 or 117 formed at predetermined intervals by forming a pattern having a plurality of sector shaped or rounded rectangular concaves arranged on one end adjacent to one end of the other deposition mask 110. The plurality of projections 115 or 117 enable to form a plurality of aperture regions 116 or 118 at the boundary of adjacent two deposition masks 110 having an eclipse shape, a leaf shape, or a rounded rectangular shape. Thus, the plurality of boundary aperture regions 116 or 118 formed between adjacent deposition masks 110 enable to deposit the organic material according to the design regardless of the gap between adjacent deposition masks 110. And, the alignment of the plurality of deposition masks 110 by using the plurality of projections 115 or 117, making a process of alignment of the plurality of deposition masks 110 easy, enables to reduce the process error.

Though the plurality of concaves of the plurality of projections 115 or 117 are illustrated and described to have a sector shape, or a rounded rectangular shape, the description or the illustration are only exemplary. As far as two curves can form a projection 115 or 117, the plurality of concaves can have any shape.

As has been described, the mask assembly of the present invention has the following advantages.

The mask assembly of the present invention includes a plurality of deposition masks including at least one of two ends having a pattern with a plurality of projections, and the plurality of projections form a plurality of boundary aperture regions at a boundary of two adjacent deposition masks. According to this, the boundary of the plurality of the deposition masks can be designed as the aperture regions. Therefore, since the organic material can be deposited according to the design at the time of an organic material deposition regardless of a gap between the boundary of the plurality of deposition masks, reduction of organic material deposition efficiency and reduction of characteristic uniformity of a finished organic light emitting display device can be prevented.

Moreover, at the time adjacent deposition masks are arranged side by side, the plurality of projections of the adjacent deposition masks are arranged to face each other at the boundary. Accordingly, since whether alignment of the deposition masks 110 is made as per the design or not can be determined numerically or visually, a process error can be reduced since a process of aligning the deposition masks 110 becomes easy.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A mask assembly including:
    a plurality of deposition masks each defined with an aperture region and a shielding region which is a periphery of the aperture region, at least one of opposite ends of each of the plurality of deposition masks is formed to have a pattern with a plurality of projections;
    a frame coupled to the plurality of deposition masks arranged continuously,
    wherein the plurality of projections of each of the plurality of deposition masks and the plurality of projections of an adjacent deposition mask are arranged to face each other, to form at least one boundary aperture region at a boundary of the adjacent two deposition masks,
    wherein the aperture region and the at least boundary aperture region are arranged respectively according to a plurality of cells formed on an active region of the substrate for receiving an organic material,
    wherein the plurality of projections of each of the plurality of deposition masks includes two faced curves meeting at a contact point which a width between the two faced curves becomes the smaller as the two curves come closer to the contact point,
    wherein apexes of the boundary aperture regions are contacted with each other along the boundary, and
    wherein each of the plurality of projections has a pointed horn shape at the boundary of the adjacent two deposition masks at the contact point.

2. The mask assembly according to claim 1, wherein the facing plurality of projections of adjacent two deposition masks are aligned in symmetry with each other, making the boundary between the adjacent two deposition masks as a symmetry axis thereof.

3. The mask assembly according to any one of claims 1 and 2, wherein the plurality of projections of each of the plurality of deposition masks are arranged at fixed intervals along the boundary with an adjacent deposition mask.

4. The mask assembly according to claim 1, wherein the plurality of projections of each of the plurality of deposition masks are formed into sector shaped concaves.

5. The mask assembly according to claim 4, wherein the concaves are congruent or similar sector shape.

6. The mask assembly according to claim 1, wherein the plurality of projections of each of the plurality of deposition masks are formed into rounded rectangular shaped concaves.

7. The mask assembly according to claim 6, wherein the concaves are congruent or similar rounded rectangle.

* * * * *